(12) United States Patent
Park et al.

(10) Patent No.: US 9,647,079 B2
(45) Date of Patent: May 9, 2017

(54) THIN FILM TRANSISTOR ARRAY PANEL AND MANUFACTURING METHOD THEREOF

(71) Applicant: Samsung Display Co., Ltd., Yongin-si, Gyeonggi-do (KR)

(72) Inventors: Jun Hyun Park, Suwon-si (KR); Kyoung Ju Shin, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/069,239

(22) Filed: Mar. 14, 2016

(65) Prior Publication Data

US 2016/0322470 A1 Nov. 3, 2016

(30) Foreign Application Priority Data

Apr. 30, 2015 (KR) .................. 10-2015-0061607

(51) Int. Cl.
*H01L 33/00* (2010.01)
*H01L 29/423* (2006.01)
*H01L 29/786* (2006.01)
*H01L 27/12* (2006.01)

(52) U.S. Cl.
CPC ...... *H01L 29/42384* (2013.01); *H01L 27/124* (2013.01); *H01L 27/1222* (2013.01); *H01L 27/1225* (2013.01); *H01L 27/1288* (2013.01); *H01L 29/7869* (2013.01); *H01L 29/78669* (2013.01); *H01L 29/78678* (2013.01); *H01L 2029/42388* (2013.01)

(58) Field of Classification Search
CPC ......... H01L 29/42384; H01L 29/78678; H01L 27/1222; H01L 27/1225
See application file for complete search history.

(56) References Cited

U.S. PATENT DOCUMENTS

| 7,061,461 | B2 | 6/2006 | Hong | |
|---|---|---|---|---|
| 2007/0139571 | A1* | 6/2007 | Kimura | ............. G02F 1/133707 349/43 |
| 2009/0283768 | A1* | 11/2009 | Wang | ................ G02F 1/133536 257/59 |
| 2013/0092923 | A1* | 4/2013 | Hara | ................... H01L 27/1214 257/43 |

(Continued)

FOREIGN PATENT DOCUMENTS

| KR | 10-2002-0009144 A | 2/2002 |
|---|---|---|
| KR | 10-2002-0064021 A | 8/2002 |

(Continued)

*Primary Examiner* — Thao P Le
(74) *Attorney, Agent, or Firm* — Innovation Counsel LLP

(57) ABSTRACT

Disclosed herein is a thin film transistor array panel, including: an insulating substrate; a gate electrode formed on the insulating substrate; a gate insulating layer formed on the gate electrode; a semiconductor layer formed on the gate insulating layer; a source electrode and a drain electrode formed on the semiconductor layer and the gate insulating layer and facing each other; and a pixel electrode connected to the drain electrode and applied with a voltage from the drain electrode, wherein a thickness of the gate insulating layer which overlaps the drain electrode but does not overlap the semiconductor layer is formed to be thinner than that which overlaps the semiconductor.

20 Claims, 17 Drawing Sheets

(56) References Cited

U.S. PATENT DOCUMENTS

| | | | | |
|---|---|---|---|---|
| 2014/0353634 | A1* | 12/2014 | Lee | H01L 27/3262 |
| | | | | 257/40 |
| 2015/0001490 | A1* | 1/2015 | Lee | H01L 27/3262 |
| | | | | 257/40 |
| 2016/0141342 | A1* | 5/2016 | Zhang | H01L 23/50 |
| | | | | 257/72 |

FOREIGN PATENT DOCUMENTS

| KR | 10-2011-0078986 A | 7/2011 |
|---|---|---|
| KR | 10-2013-0140897 A | 12/2013 |

\* cited by examiner

THIN FILM TRANSISTOR ARRAY PANEL AND MANUFACTURING METHOD THEREOF

CROSS-REFERENCE TO RELATED APPLICATION

This application claims priority to and the benefit of Korean Patent Application No. 10-2015-0061607 filed in the Korean Intellectual Property Office on Apr. 30, 2015, the entire contents of which are incorporated herein by reference.

BACKGROUND (a) Field

The Embodiment of the present inventive concept relates to a thin film transistor array panel and a manufacturing method thereof, and more particularly, to a thin film transistor array panel for a liquid crystal display and a manufacturing method thereof.

(b) Description of the Related Art

A liquid crystal display (LCD) is one of display devices which have been most widely used currently and is a device which is configured of two sheets of display panels on which electrodes are formed and a liquid crystal layer interposed therebetween and applies a voltage to the electrodes to form an electric field so as to realign liquid crystal molecules of the liquid crystal layer and control transmittance of light depending thereon, thereby displaying an image.

The liquid crystal display includes a thin film transistor, the display panel of the liquid crystal display including the thin film transistor is provided with a gate line and a data line which intersect each other, and a pixel corresponding to an area in which a screen is displayed is connected to the thin film transistor.

When the thin film transistor is turned on by applying a gate-on voltage to the gate line, a data voltage applied through the data line is charged in a pixel. An arrangement state of a liquid crystal layer is determined depending on an electric field formed between a pixel voltage charged in the pixel and a common voltage applied to a common electrode. The data voltage may be applied, having different polarities for each frame.

The data voltage applied to the pixel is shifted by parasitic capacitance Cgs between a gate electrode and a source electrode to form the pixel voltage. In this case, the shifted voltage is called a kick back voltage.

The kick back voltage has a value changed depending on a grayscale and polarity of the data voltage and thus the pixel voltage is different for each frame. A mura, luminance or chrominance non-uniformity of a display device, may occur on the screen due to a deviation of the kick back voltage.

The above information disclosed in this Background section is only for enhancement of understanding of the background of the inventive concept and therefore it may contain information that does not form the prior art that is already known in this country to a person of ordinary skill in the art.

SUMMARY

The present inventive concept has been made in an effort to provide a thin film transistor array panel for a liquid crystal display and a manufacturing method thereof capable of reducing a deviation of a kick back voltage.

An exemplary embodiment of the present inventive concept provides a thin film transistor array panel, including: an insulating substrate; a gate electrode formed on the insulating substrate; a gate insulating layer formed on the gate electrode; a semiconductor layer formed on the gate insulating layer; a source electrode and a drain electrode formed on the semiconductor layer and the gate insulating layer and facing each other; and a pixel electrode connected to the drain electrode and applied with a voltage from the drain electrode, wherein a thickness of the gate insulating layer which overlaps the drain electrode but does not overlap the semiconductor layer is formed to be thinner than that which overlaps the semiconductor layer.

A thickness of the gate insulating layer which overlaps the drain electrode but does not overlap the semiconductor layer is formed to be thinner than that which overlaps the semiconductor layer.

The thin film transistor array panel may further include: a first passivation layer formed on exposed portions of the source electrode, the drain electrode, the gate insulating layer, and the semiconductor layer; and a second passivation layer formed on the first passivation layer.

The first passivation layer may be made of an organic insulating material or an inorganic insulating material and the second passivation layer may be made of an organic insulating material.

The second passivation layer may be a color filter displaying one of primary colors.

The thin film transistor array panel may further include: a common electrode disposed on the second passivation layer and applied with a common voltage having a predetermined magnitude; and an insulating layer disposed on the common electrode.

The common electrode may be formed in a planar shape having openings disposed in an area corresponding to the periphery of the drain electrode.

The pixel electrode may be disposed on the insulating layer and may be physically and electrically connected to the drain electrode through the contact hole formed on the first passivation layer, the second passivation layer, and the insulating layer.

The thin film transistor array panel may further include: a gate line including the gate electrode; a data line including the source electrode; and a connection area disposed at an end of at least one of the gate line and the data line.

The connection area may include: a first conductive layer which is made of the same material as the gate line and is formed on the insulating substrate at the time of forming the gate line; a gate insulating layer formed on the first conductive layer; a semiconductor layer formed on the gate insulating layer; a second conductive layer physically and electrically connected to the first conductive layer through a first contact hole through which is formed on the gate insulating layer and the semiconductor layer to expose the first conductive layer; and a first passivation layer formed on the second conductive layer and the gate insulating layer; a second passivation layer formed on the first passivation layer; an insulating layer formed on the second passivation layer; and a connection electrode physically and electrically connected to the second conductive layer through a second contact hole which is formed on the first passivation layer, the second passivation layer, and the insulating layer to expose the second conductive layer.

The second conductive layer may be made of the same material as the source electrode and the drain electrode at the time of forming the source electrode and the drain electrode.

The connection electrode may be made of the same material as the pixel electrode as the time of forming the pixel electrode.

The semiconductor layer may include any one of amorphous silicon and polysilicon.

The semiconductor layer may include oxide semiconductor.

Another embodiment of the present inventive concept provides a manufacturing method of a thin film transistor array panel, including: forming a gate electrode on an insulating substrate; forming a gate insulating layer on the gate electrode; forming a semiconductor layer on the gate insulating layer; performing an a photo-lithography process using a mask including a half-transmitting part which is formed in an area corresponding to a position at which a drain electrode is formed; forming a source electrode and a drain electrode on the semiconductor layer and the gate insulating layer while facing each other; and forming a pixel electrode connected to the drain electrode and applied with a voltage from the drain electrode, wherein a thickness of the gate insulating layer which overlaps the drain electrode but does not overlap the semiconductor layer is formed to be thinner than that which overlaps the semiconductor layer.

The half-transmitting part may be formed in an area corresponding to a position at which the source electrode is formed.

The manufacturing method may further include: forming a first passivation layer on exposed portions of the source electrode, the drain electrode, the gate insulating layer, and the semiconductor layer; and forming a second passivation layer formed on the first passivation layer.

The manufacturing method may further include: forming a common electrode disposed on the second passivation layer and applied with a common voltage having a predetermined magnitude; and forming an insulating layer disposed on the common electrode.

The manufacturing method may further include: forming a contact hole through the first passivation layer, the second passivation layer, and the insulating layer to expose the drain electrode.

The pixel electrode may be disposed on the insulating layer and may be physically and electrically connected to the drain electrode through the contact hole.

According to an exemplary embodiment of the present inventive concept, it is possible to reduce the deviation of the kick back voltage in the liquid crystal display and prevent the screen mura from occurring due to the deviation of the kick back voltage.

DETAILED DESCRIPTION

Figure 1:
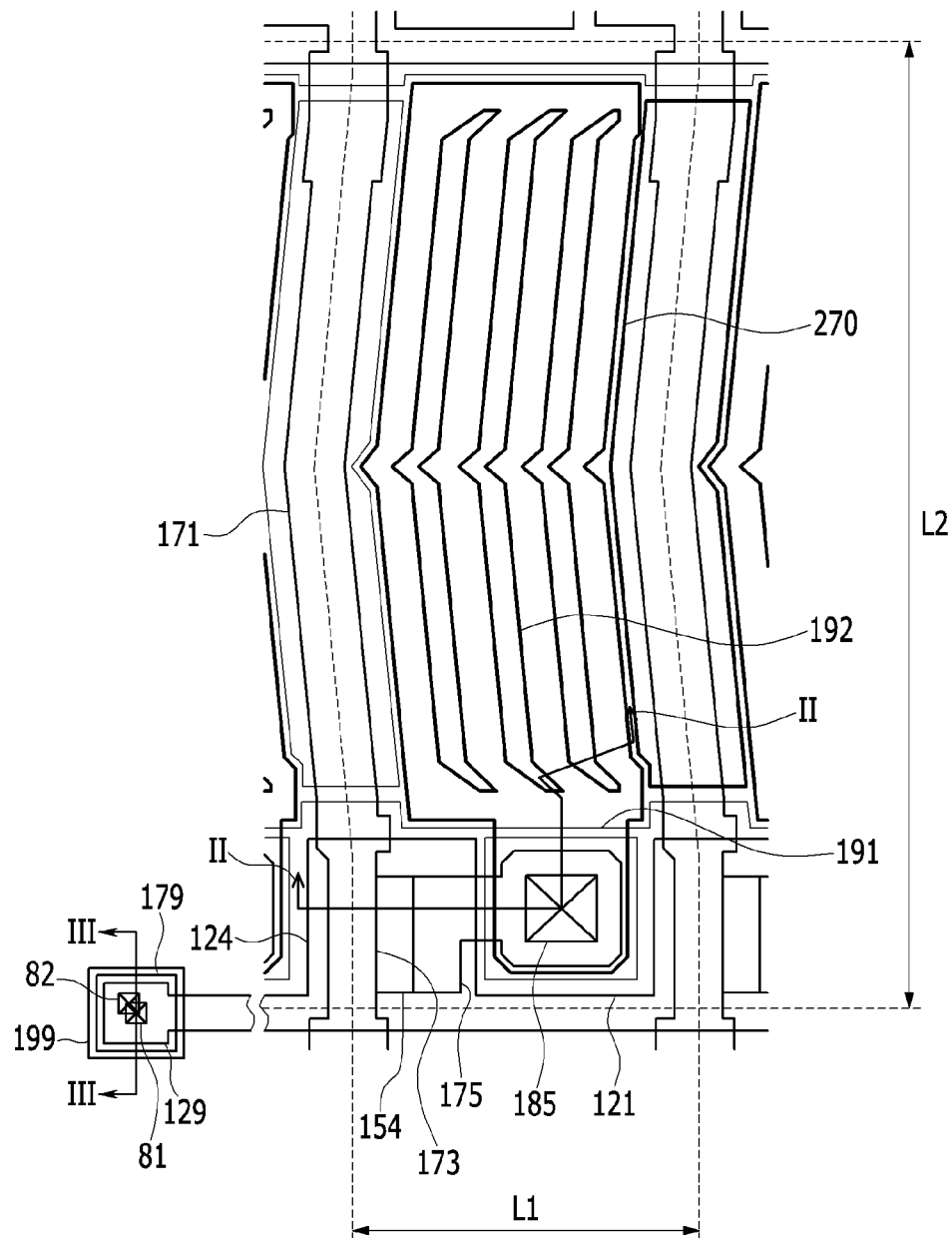
FIG. 1 is a plan view illustrating a thin film transistor array panel for a liquid crystal display according to an exemplary embodiment of the present inventive concept.

Hereinafter, the present inventive concept will be described more fully with reference to the accompanying drawings, in which exemplary embodiments of the inventive concept are shown. As those skilled in the art would realize, the described embodiments may be modified in various different ways, all without departing from the spirit or scope of the present inventive concept.

Further, in exemplary embodiments, since like reference numerals designate like elements having the same configuration, a first exemplary embodiment is representatively described, and in other exemplary embodiments, only a configuration different from the first exemplary embodiment will be described.

Accordingly, the drawings and description are to be regarded as illustrative in nature and not restrictive. Like reference numerals designate like elements throughout the specification.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present. In addition, throughout the present specification, when any one part is referred to as being "connected to" another part, it means that any one part and another part are "directly connected to" each other or are "electrically connected to" each other with the other part interposed therebetween. In addition, unless explicitly described to the contrary, the word "comprise" and variations such as "comprises" or "comprising", will be understood to imply the inclusion of stated elements but not the exclusion of any other elements.

Hereinafter, a thin film transistor array panel for a liquid crystal display according to an exemplary embodiment of the present inventive concept will be described in detail with reference to the accompanying drawings.

Figure 2:
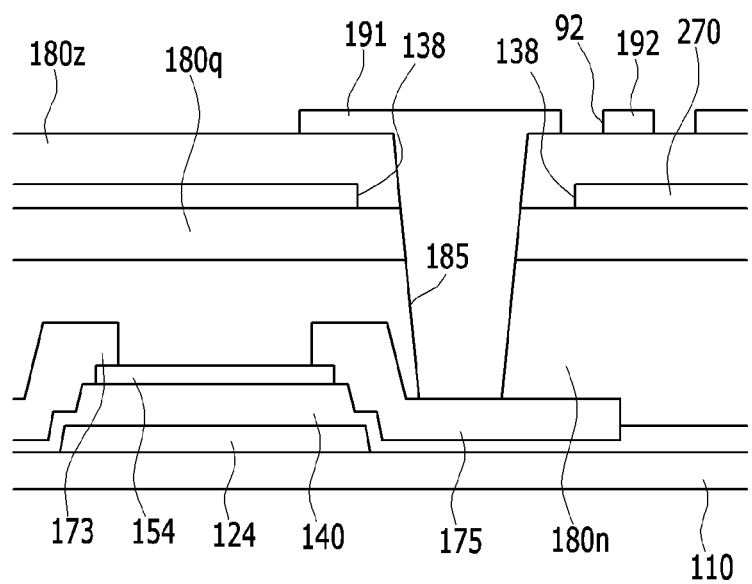
FIG. 2 is a cross-sectional view of the thin film transistor array panel according to the exemplary embodiment of the present inventive concept illustrated in FIG. 1 taken along the line II-II.
Figure 3:
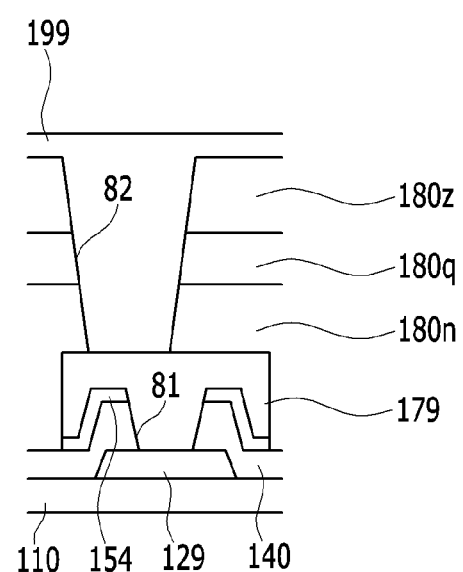
FIG. 3 is a cross-sectional view of the thin film transistor array panel according to the exemplary embodiment of the present inventive concept illustrated in FIG. 1 taken along the line III-III.

FIG. 1 is a plan view illustrating a thin film transistor array panel for a liquid crystal display according to an exemplary embodiment of the present inventive concept. FIG. 2 is a cross-sectional view of the thin film transistor array panel according to the exemplary embodiment of the present inventive concept illustrated in FIG. 1 taken along the line II-II. FIG. 3 is a cross-sectional view of the thin film transistor array panel according to the exemplary embodiment of the present inventive concept illustrated in FIG. 1 taken along the line III-III.

Referring to FIGS. 1 to 3, a gate conductor including a gate line 121 is formed on an insulating substrate 110 made of transparent glass, plastic, or the like.

The gate line 121 includes a wide end 129 for connection between the gate electrode 124 and another layer or an external driving circuit. The gate lines 121 transfers gate signals and mainly extend in a horizontal direction. An area in which the wide end 129 of the gate line 121 is formed is called a first connection area and the first connection area may be formed in a structure illustrated in FIG. 3.

The gate line 121 may be made of aluminum-based metals, such as aluminum (Al) and aluminum alloy, silver-based metals, such as silver (Ag) and silver alloy, copper-based metals, such as copper (Cu) and copper alloy, molybdenum-based metals, such as molybdenum (Mo) or molybdenum alloy, chromium (Cr), tantalum (Ta), titanium (Ti), and the like. However, the gate line 121 may also have a multilayer structure including at least two conductive layers having different physical properties.

A gate insulating layer 140 made of silicon nitride (SiNx), silicon oxide (SiOx), or the like is formed on the gate line 121 and the wide end 129 of the gate line 121. The gate insulating layer 140 may also have a multilayer structure including at least two insulating layers having different physical properties.

A semiconductor layer 154 made of amorphous silicon, polysilicon, or the like is formed on the gate insulating layer 140. The semiconductor layer 154 may include oxide semiconductor. The oxide semiconductor may include any one of an oxide of titanium (Ti), hafnium (Hf), zirconium (Zr), aluminum (Al), tantalum (Ta), germanium (Ge), zinc (Zn), gallium (Ga), tin (Sn), or indium (In), and a zinc oxide (ZnO), an indium-gallium-zinc oxide (InGaZnO$_4$), an indium-zinc oxide (Zn—In—O), a zinc-tin oxide (Zn—Sn—O), an indium-gallium oxide (In—Ga—O), an indium-tin oxide (In—Sn—O), an indium-zirconium oxide (In—Zr—O), an indium-zirconium-zinc oxide (In—Zr—Zn—O), an indium-zirconium-tin oxide (In—Zr—Sn—O), an indium-zirconium-gallium oxide (In—Zr—Ga—O), an indium-aluminum oxide (In—Al—O), an indium-zinc-aluminum oxide (In—Zn—Al—O), an indium-tin-aluminum oxide (In—Sn—Al—O), an indium-aluminum-gallium oxide (In—Al—Ga—O), an indium-tantalum oxide (In—Ta—O), an indium-tantalum-zinc oxide (In—Ta—Zn—O), an indium-tantalum-tin oxide (In—Ta—Sn—O), an indium-tantalum-gallium oxide (In—Ta—Ga—O), an indium-germanium oxide (In—Ge—O), an indium-germanium-zinc oxide (In—Ge—Zn—O), an indium-germanium-tin oxide (In—Ge—Sn—O), an indium-germanium-gallium oxide (In—Ge—Ga—O), a titanium-indium-zinc oxide (Ti—In—Zn—O), and a hafnium-indium-zinc oxide (Hf—In—Zn—O), which are composite oxides thereof.

The data line 171 including a source electrode 173 and a data conductor including the drain electrode 175 are formed on the semiconductor layer 154 and the gate insulating layer 140. An ohmic contact (not illustrated) may be formed between the semiconductor layer 154 and the source electrode 173 and between the semiconductor layer 154 and the drain electrode 175. The ohmic contact may be made of materials, such as n+ hydrogenated amorphous silicon, which is doped with an n-type impurity, such as phosphorous, at a high concentration or may be made of silicide. The ohmic contact is paired and thus may be disposed on the semiconductor layer 154. When the semiconductor layer 154 is the oxide semiconductor, the ohmic contacts 163 and 165 may be omitted.

The data line 171 includes a wide end (not illustrated) for connection with another layer or an external driving circuit. The area in which the wide end of the data line 171 is formed is called a second connection area. The second connection area may have a similar structure as a first connection area except the second connection area does not include the wide end 129 of the gate line 121 and a first contact hole 81 and therefore the description of the second connection area will be omitted.

The data lines 171 transfer the data signals and mainly extend in a vertical direction to intersect the gate lines 121. In this case, the data line 171 may have the first curved part having a bent shape to obtain the maximum transmittance of the liquid crystal display, in which the curved part may have a V-letter shape meeting two straight lines in the intermediate region of the pixel region. The intermediate region of the pixel area may be further provided with a second curved part which is curved at a predetermined angle with respect to the first curved part.

The source electrode 173 is a portion of the data line 171 and is disposed on the same line as the data line 171. The drain electrode 175 is formed to extend in parallel with the source electrode 173 and the source electrode 173 and the drain electrode 175 face each other. Therefore, the drain electrode 175 is parallel with a portion of the data line 171.

The gate electrode 124, the source electrode 173, and the drain electrode 175 form a thin film transistor (TFT) along with the semiconductor layer 154 and the channel of the thin film transistor is formed in the semiconductor layer 154 between the source electrode 173 and the drain electrode 175.

Meanwhile, a thickness of a portion contacting the source electrode 173 and a thickness of a portion contacting the drain electrode 175 in the gate insulating layer 140 are formed to be thinner than that of other portions. For example, a thickness of the gate insulating layer which overlaps the drain electrode but does not overlap the semiconductor layer is formed to be thinner than that which overlaps the semiconductor layer. Therefore, it is possible to reduce a deviation of a kick back voltage formed by parasitic capacitance of the thin film transistor. A detailed description thereof will be described below with reference to FIGS. 16 and 17. The thin film transistor array panel according to the exemplary embodiment of the present inventive concept includes the source electrode 173 which is disposed on the same line as the data line 171 and the drain electrode 175 which extends in parallel with the data line 171, such that a channel width of the thin film transistor may be expanded without expanding the area occupied by the data conductor, thereby increasing an aperture ratio of the liquid crystal display.

The data line 171 and the drain electrode 175 may be made of refractory metals, such as molybdenum, chromium, tantalum, titanium, and the like or an alloy thereof and may have a multilayer structure including a refractory metal layer (not illustrated) and a low-resistance conductive layer (not illustrated). An example of the multilayer structure may include a double layer of a chromium or molybdenum (alloy) lower layer and an aluminum (alloy) upper layer and a triple layer of a molybdenum (alloy) lower layer, an aluminum (alloy) intermediate layer, and a molybdenum (alloy) upper layer.

A first passivation layer 180n is formed on the data conductors 171, 173, and 175, the gate insulating layer 140, and an exposed portion of the semiconductor layer 154. The first passivation layer 180n may be made of an organic insulating material, an inorganic insulating material, or the like.

A second passivation layer 180q is formed on the first passivation layer 180n. The second passivation layer 180q may be made of an organic insulating material.

The second passivation layer 180q may be a color filter. When the second passivation layer 180q is a color filter, the second passivation layer 180q may uniquely display one of the primary colors and an example of the primary colors may include the three primary colors, such as red, green, and blue, or yellow, cyan, magenta, and the like. Although not illustrated, the color filter may further include a color filter which displays a mixed color of the primary colors or white, in addition to the primary colors.

A common electrode 270 is disposed on the second passivation layer 180q. The common electrode 270 has the planar shape and may be formed over the insulating substrate 110 as an integrated plate and has an opening 138 which is disposed in the corresponding region around the drain electrode 175. That is, the common electrode 270 may have the plate-like plane shape.

The common electrodes 270 which are adjacent pixels are connected to each other and thus may be applied with a common voltage which is supplied from the outside of the display area and has a predetermined magnitude.

An insulating layer 180z is disposed on the common electrode 270. The insulating layer 180z may be made of an organic insulating material, an inorganic insulating material, or the like.

The pixel electrode 191 is disposed on the insulating layer 180z. The pixel electrode 191 includes a curved edge substantially parallel to the curved part of the data line 171. The pixel electrode 191 has a plurality of cutouts 92 and includes a plurality of branch electrodes 192 which are disposed between the adjacent cutouts 92.

The pixel electrode 191 is a first field generating electrode or a first electrode and the common electrode 270 is a second field generating electrode or a second electrode. The pixel electrode 191 and the common electrode 270 may form a horizontal electric field.

The first passivation layer 180n, the second passivation layer 180q, and the insulating layer 180z may include a contact hole 185 through which the drain electrode 175 is exposed. The pixel electrode 191 is physically and electrically connected to the drain electrode 175 through the contact hole 185 and is thus applied with a data voltage from the drain electrode 175.

Hereinafter, a structure of the first connection area illustrated in FIG. 3 will be described.

The wide end 129 of the gate line 121 is formed on the insulating substrate 110. The wide end 129 of the gate line 121 according to the exemplary embodiment of the present inventive concept may be an independent first conductive layer which is formed simultaneously with the gate line 121 and is not connected to the gate line 121. That is, the first conductive layer may be made of the same material as the gate line 121.

The gate insulating layer 140 is formed on the wide end 129 of the gate line 121 and the semiconductor layer 154 is formed on the gate insulating layer 140. The first contact hole 81 through which the wide end 129 of the gate line 121 is exposed is formed on the gate insulating layer 140 and the semiconductor layer 154.

The second conductive layer 179 which is formed simultaneously with the data conductors 171, 173, and 175 is formed on exposed portions of the semiconductor layer 154 and the wide end 129 of the gate line 121. That is, the second conductive layer 179 may be made of the same material as the data conductors 171, 173, and 175. The second conductive layer 179 is physically and electrically connected to the wide end 129 of the gate line 121 through the first contact hole 81.

The first passivation layer 180n is formed on the second conductive layer 179 and the gate insulating layer 140. A second passivation layer 180q is formed on the first passivation layer 180n. An insulating layer 180z is formed on the second passivation layer 180q. The first passivation layer 180n, the second passivation layer 180q, and the insulating layer 180z include a second contact hole 82 through which the second conductive layer 179 is exposed.

A connection electrode 199 formed simultaneously with the pixel electrode 191 is formed on the exposed portions of the insulating layer 180z and the second conductive layer 179. That is, the connection electrode 199 may be made of the same material as the pixel electrode 191. The connection electrode 199 is physically and electrically connected to the second conductive layer 179 through the second contact hole 82.

The connection electrode 199 may be connected to an external driving circuit and a gate signal generated from the external driving circuit is transferred to the wide end 129 of the gate line 121 through the connection electrode 199 and thus the gate signal may be applied to the gate line 121.

Here, the structure of the first connection area connected to the gate line 121 will be described. The structure of the second connection area which is connected to the data line 171 may be similar to the first connection area except the second connection area does not include the wide end 129 of the gate line 121 and a first contact hole 81. However, the second conductive layer 179 formed simultaneously with forming the data conductors 171, 173, and 175 in the second connection area is the wide end of the data line 171 and connected to the data line 171 and the wide end of the gate line 121 is only formed simultaneously with forming the gate line 121 and is not connected to the gate line 121.

Hereinafter, FIGS. 4 to 15 are diagrams illustrating a manufacturing method of the thin film transistor array panel according to the exemplary embodiment of the present inventive concept illustrated in FIGS. 1 to 3.

FIGS. 4 to 15 are diagrams sequentially illustrating a manufacturing method of the thin film transistor array panel according to the exemplary embodiment of the present inventive concept illustrated in FIGS. 1 to 3.

Figure 4:
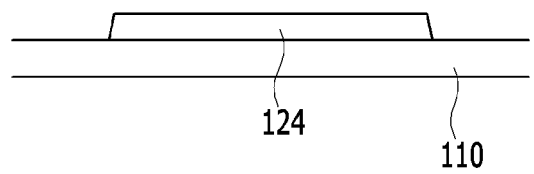
FIGS. 4, 5, 6, 7, 8, 9, 10, 11, 12, 13, 14 and 15 are diagrams sequentially illustrating a manufacturing method of the thin film transistor array panel according to the exemplary embodiment of the present inventive concept illustrated in FIGS. 1 to 3.
Figure 5:
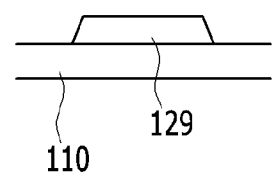

As illustrated in FIGS. 4 and 5, the gate electrode 124 and the wide end 129 of the gate line 121 are formed on the insulating substrate 110 made of transparent glass, plastic, or the like. That is, the gate electrode 124 and the wide end 129 of the gate line 121 are formed during the process of forming the gate line 121 on the insulating substrate 110. The process of forming the gate line 121 may be performed by a method of forming the conductive layer on the insulating substrate 110 by sputtering, etc., and then patterning the formed conductive layer by an etching process using a mask.

Figure 6:
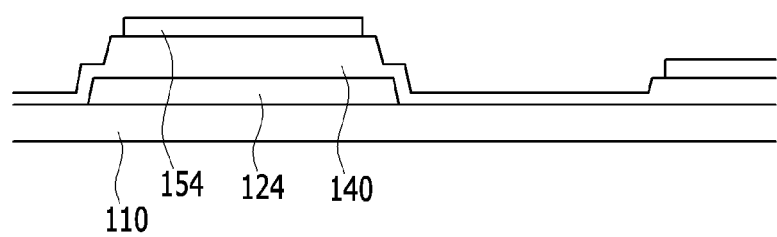
Figure 7:
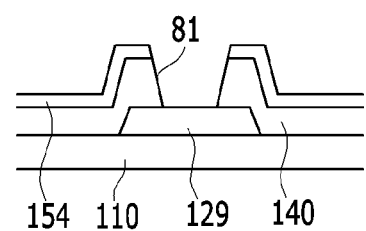

Next, as illustrated in FIGS. 6 and 7, after sequentially forming the gate insulating layer 140 on the gate electrode 124 and the wide end 129 of the gate line 121, the semiconductor layer 154 on the gate insulating layer 140 and a photoresist layer (not shown) on the semiconductor layer 154, an exposure process using the mask (not shown) is performed.

The mask includes a light blocking part BL, a half-transmitting part HT, and a transmitting part FT. The mask may be a halftone photomask or a slit mask. The half-transmitting part HT is formed in an area corresponding to a position at which the source electrode 173 and the drain electrode 175 will be formed. The transmitting part FT is formed in an area corresponding to a position at which the first contact hole 81 will be formed. The light blocking part (BL) is formed in an area corresponding to the position at which the semiconductor layer 154 will be formed. An exposure quantity through the half-transmitting part HT is smaller than that through the transmitting part FT and an etched degree may be controlled by appropriately controlling the exposure quantity through the half-transmitting part HT. A developing process is performed after the exposure process to form a thick photo-resist layer (not shown) on an area corresponding to the semiconductor layer 154, intermediate thickness photo-resist layers (not shown) on areas corresponding to the source electrode 170 and the drain electrode 175 and a thin photo-resist layer (not shown) on an area corresponding to the first contact hole 81, The semiconductor layer 154 and the gate insulating layer 140 on a region corresponding to the first contact hole 81 is removed to form the first contact hole 81. After forming the first contact hole 81, the semiconductor layer 154 of the portion corresponding to the half-transmitting part HT is removed by an etching process after an ashing process is performed. During the ashing process, the intermediated thickness photo-resist layer corresponding to the half-transmitting part HT is completely removed and the thick photo-resist layer corresponding to the light blocking part BL is partially removed. After removing the semiconductor layer 154 of the portion corresponding to half-transmitting part HT, a partial portion of the gate insulating layer 140 is removed, and thus the thickness of the gate insulating layer 140 which overlap the source electrode 173 and the drain electrode 175 but does not overlap the semiconductor layer 154 is reduced. The etching of the gate insulating layer 140 is performed by dry etching method such as plasma etching and reactive ion etching. The etching of the gate insulating layer 140 is performed by wet etching method.

Figure 8:
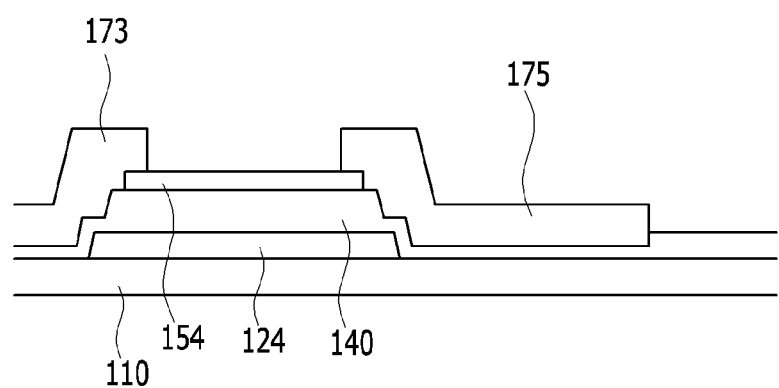
Figure 9:
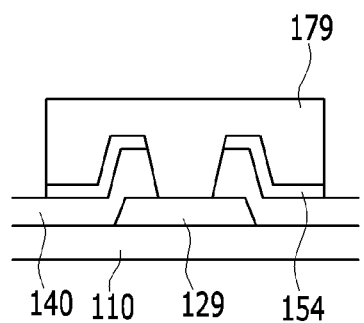

Next, the conductive layer is formed on the insulating substrate 110 by the sputtering and then is patterned by the etching process using a mask, and thus as illustrated in FIGS. 8 and 9, the data conductor including the source electrode 173 and the drain electrode 175 and the second conductive layer 179 of the first connection area are formed on the semiconductor layer 154 and the gate insulating layer 140.

Figure 10:
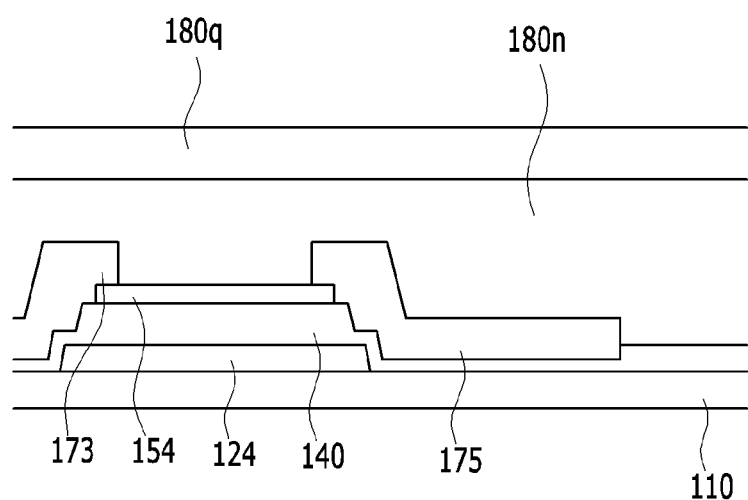
Figure 11:
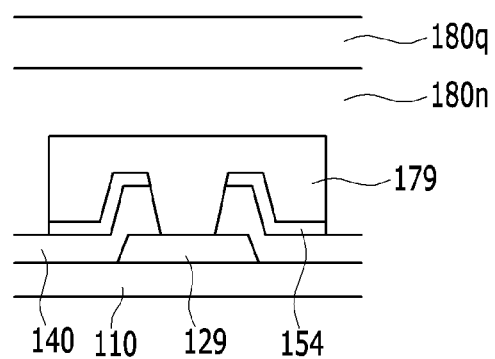

Next, as illustrated in FIGS. 10 and 11, the first passivation layer 180n is formed on the exposed portions of the source electrode 173, the drain electrode 175, the second conductive layer 179, the gate insulating layer 140, and the semiconductor layer 154. Further, the second passivation layer 180q is formed on the first passivation layer 180n. The second passivation layer 180q may be a color filter. When the second passivation layer 180q is a color filter the color filter is patterned to form a required primary color filters such as a red color filter, a green color filter and a blue color filter. The primary color filters may further include a cyan color filter, a yellow color filter and a magenta color filter.

Figure 12:
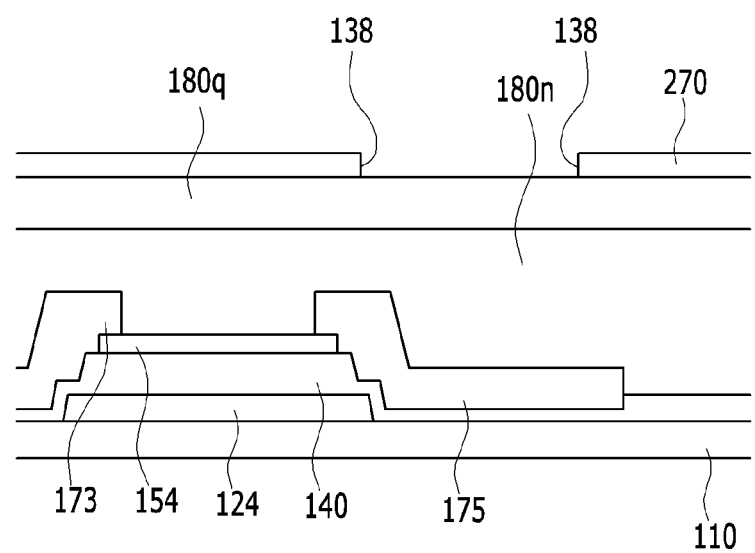
Figure 13:
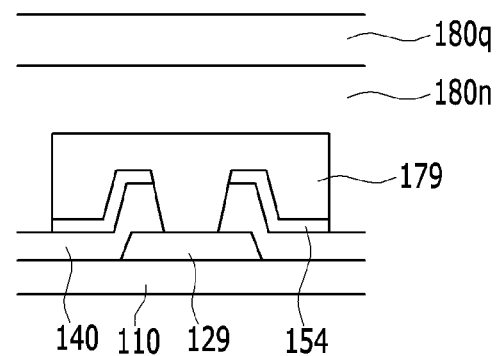

Next, as illustrated in FIGS. 12 and 13, the common electrode 270 is formed on the second passivation layer 180q. The common electrode 270 may be patterned by a conventional photo-lithography process. The common electrode 270 may be made of transparent conductive materials such as polycrystalline, single crystalline, amorphous indium tin oxide (ITO) and indium zinc oxide (IZO).

Figure 14:
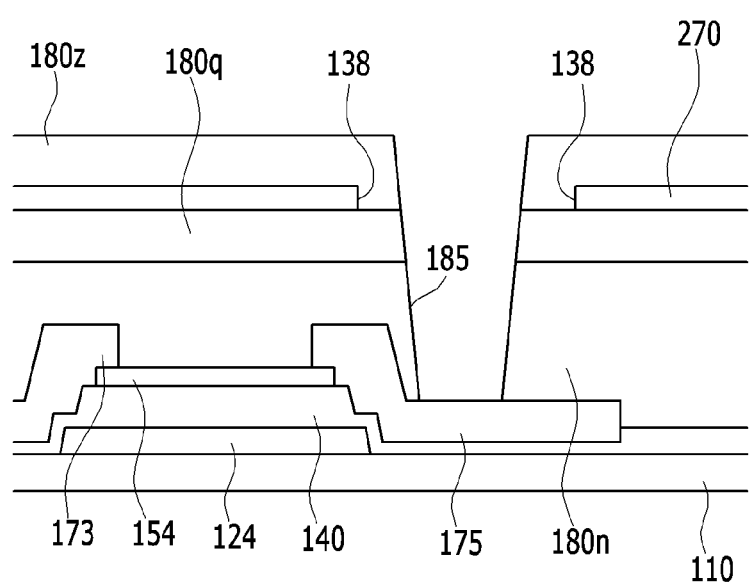
Figure 15:
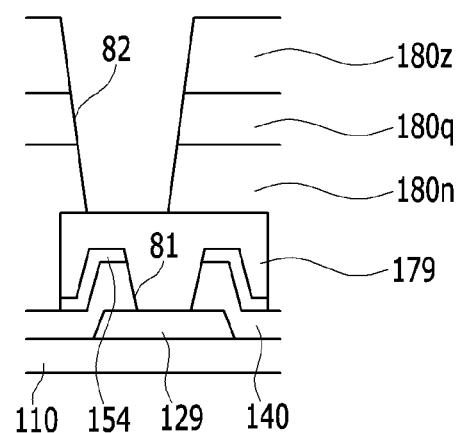

Next, as illustrated in FIGS. 14 and 15, the insulating layer 180z is formed on the common electrode 270 and the contact hole 185 through the first passivation layer 180n, the second passivation layer 180q, and the insulating layer 180z to expose the drain electrode 175 and the second contact hole 82 exposing the second conductive layer 179 are formed by a conventional photo-lithography process using a mask.

Next, the conductive layer is formed on the insulating layer 180z by a sputtering process. The conductive layer is patterned by a conventional photo-lithography process using a mask to form the pixel electrode 191 and the connection electrode 199 as illustrated in FIGS. 2 and 3.

Hereinafter, the parasitic capacitance of the thin film transistor in the thin film transistor array panel according to the exemplary embodiment of the exemplary embodiment of the present inventive concept will be described with reference to FIGS. 16 and 17.

Figure 16:
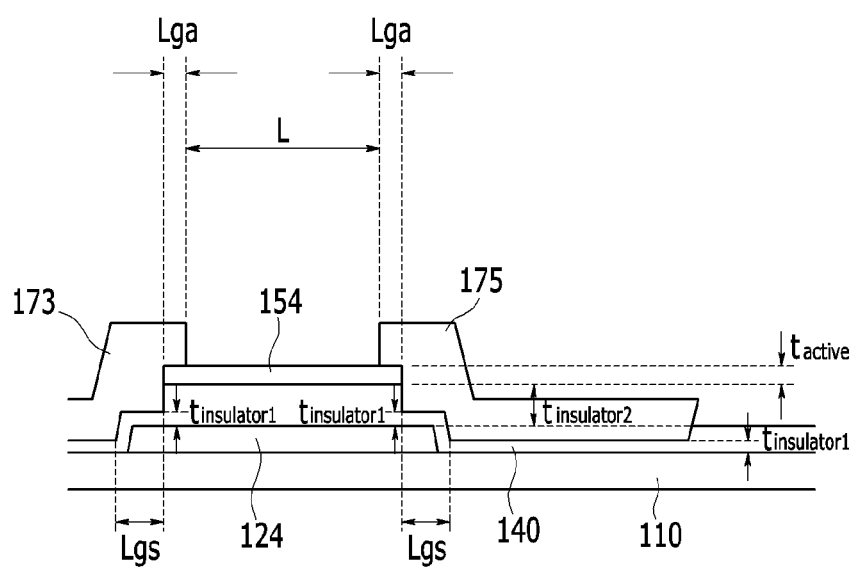
FIG. 16 is a diagram for describing parasitic capacitance of the thin film transistor in the thin film transistor array panel according to the exemplary embodiment of the present inventive concept illustrated in FIGS. 1 to 3.

FIG. 16 is a diagram for describing the parasitic capacitance of the thin film transistor in the thin film transistor array panel according to the exemplary embodiment of the present inventive concept illustrated in FIGS. 1 to 3.

The parasitic capacitance of the thin film transistor according to the exemplary embodiment of the present inventive concept may be formed as the following Equation 1 when the thin film transistor is in an off-state and may be formed as the following Equation 2 when the thin film transistor is in on-state. The parasitic capacity by any one of the source electrode 173 and the drain electrode 175 is shown herein The parasitic capacitance by both of the source electrode 173 and the drain electrode 175 may be obtained by substituting 2 Lga and 2 Lgs instead of Lga and Lgs in the flowing Equations 1 and 2.

$$\text{Coff} = (C1 \times C2)/C1 + C2)) + C3$$

$$C1 = (\epsilon_0 \epsilon_{r1}/t_{insulator2})(W \times Lga)$$

$$C2 = (\epsilon_0 \epsilon_{r2}/t_{active})(W \times Lga)$$

$$C3 = (\epsilon_0 \epsilon_{r1}/t_{insulator1})(W \times Lgs) \qquad \text{(Equation 1)}$$

$$\text{Con} = C1 + C2$$

$$C1 = (\epsilon_0 \epsilon_{r1}/t_{insulator2})(W \times (L \times Lga))$$

$$C2 = (\epsilon_0 \epsilon_{r1}/t_{insulator1})(W \times Lgs) \qquad \text{(Equation 2)}$$

Here, Coff is the parasitic capacitance of the thin film transistor which is in the off-state and Con is the parasitic capacitance of the thin film transistor which is in the on-state. W is a channel width of the thin film transistor, Lga is a length of the overlapping portion of the source electrode 173 (or drain electrode 175) with the semiconductor layer 154, the Lgs is a length of the overlapping portion of the gate electrode 124 with the source electrode 173 (or drain electrode 175) without overlapping the semiconductor layer 154, and the L is a channel length of the portion at which the source electrode 173 and the drain electrode 175 does not overlap each other in the semiconductor layer 154. The $t_{insulator1}$ is a thickness of the portion contacting the source electrode 173 (or drain electrode 175) in the gate insulating layer 140, that is, in FIG. 6, a thickness of the gate insulating layer 140 of the portion at which the thickness is thin, the $t_{insulator2}$ is an original thickness of the gate insulating layer 140, and $t_{active}$ is a thickness of the semiconductor layer 154. The $\epsilon_0$ is a dielectric constant in a vacuum state, $\epsilon_{r1}$ is a dielectric constant of the gate insulating layer 140, and $\epsilon_{r2}$ is a dielectric constant to the semiconductor layer 154.

As the $t_{insulator1}$ is small, the values of the Coff and Con are a similar value and approximate each other. That is, the thinner the thickness of the portion contacting the source electrode 173 (or drain electrode 175) in the gate insulating layer 140, the smaller the deviation of the parasitic capacitance of the thin film transistor becomes. When the deviation of the parasitic capacitance of the thin film transistor is reduced, the deviation of the kick back voltage is also reduced. Therefore, the screen mura due to the deviation of the kick back voltage may be improved.

Figure 17:
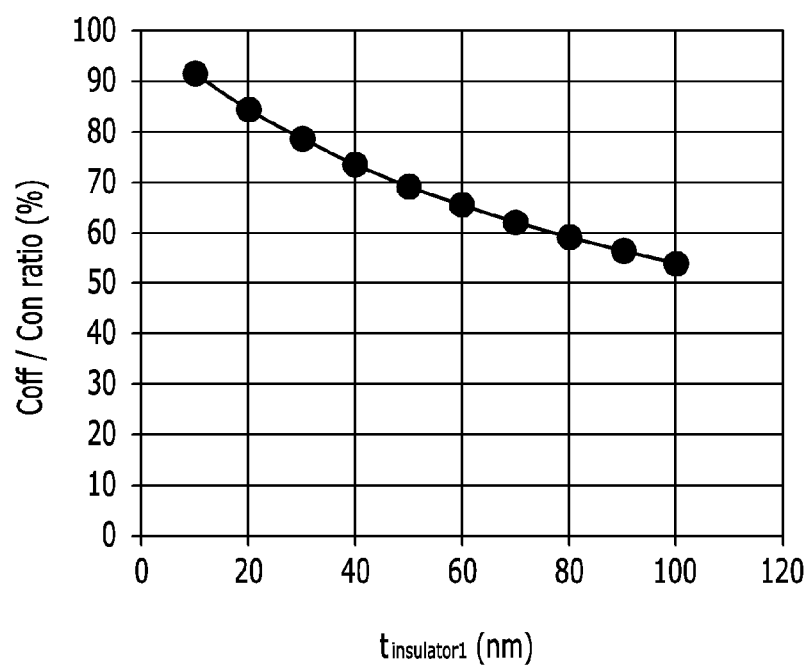
FIG. 17 is a graph illustrating simulation results of a change in a ratio of off-state parasitic capacitance to on-state parasitic capacitance.

FIG. 17 is a graph illustrating simulation results of a change in a ratio of the off-state parasitic capacitance to the on-state parasitic capacitance.

The ratio of Coff/Con is simulated while $t_{insulator1}$ is changed in the thin film transistor in which Lga is 0.5 μm, the Lgs is 1.5 μm, W is 4 μm, L is 4.2 μm, $t_{insulator2}$ is 300 nm, and $t_{active}$ is 35 nm.

It may be appreciated from FIG. 17 that as the $t_{insulator1}$ is reduced, the ratio of Coff/Con approximates 100%. That is, the deviation of the parasitic capacitance of the thin film transistor is reduced.

The exemplary embodiment of the present inventive concept describes that the thickness of the portion contacting the source electrode 173 and the thickness of the portion contacting the drain electrode 175 in the gate insulating layer 140 are reduced and thus the deviation of the parasitic capacitance of the thin film transistor is reduced. However, the exemplary embodiment of the present inventive concept may have the thickness of the original gate insulating layer 140 without reducing the thickness of the portion contacting the source electrode 173 in the gate insulating layer 140. This is to prevent the delay of the data line 171 from increasing.

The accompanying drawings and the detailed description of the present inventive concept which are referred until now are only an example of the present inventive concept, and are only used to describe the present inventive concept but are not used to limit the meaning or the scope of the present inventive concept described in the appended claims. Therefore, it will be appreciated to those skilled in the art that various modifications are made and other equivalent embodiments are available. Accordingly, the actual technical protection scope of the present inventive concept must be determined by the technical spirit of the appended claims.

While this inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

What is claimed is:

1. A thin film transistor array panel, comprising:
an insulating substrate;
a gate electrode formed on the insulating substrate;
a gate insulating layer formed on the gate electrode;
a semiconductor layer formed on the gate insulating layer;
a source electrode and a drain electrode formed on the semiconductor layer and the gate insulating layer and facing each other; and
a pixel electrode connected to the drain electrode and applied with a voltage from the drain electrode,
wherein a thickness of the gate insulating layer which overlaps the drain electrode but does not overlap the semiconductor layer is formed to be thinner than that which overlaps the semiconductor layer.

2. The thin film transistor array panel of claim 1, wherein:
a thickness of the gate insulating layer which overlaps the drain electrode but does not overlap the semiconductor layer is formed to be thinner than that which overlaps the semiconductor layer.

3. The thin film transistor array panel of claim 1, further comprising:
a first passivation layer formed on exposed portions of the source electrode, the drain electrode, the gate insulating layer, and the semiconductor layer; and
a second passivation layer formed on the first passivation layer.

4. The thin film transistor array panel of claim 3, wherein:
the first passivation layer is made of an organic insulating material or an inorganic insulating material and the second passivation layer is made of an organic insulating material.

5. The thin film transistor array panel of claim 4, wherein:
the second passivation layer is a color filter displaying one of primary colors.

6. The thin film transistor array panel of claim 3, further comprising:
a common electrode disposed on the second passivation layer and applied with a common voltage having a predetermined magnitude; and
an insulating layer disposed on the common electrode.

7. The thin film transistor array panel of claim 6, wherein:
the common electrode is formed in a planar shape having openings disposed in an area corresponding to the periphery of the drain electrode.

8. The thin film transistor array panel of claim 7, wherein:
the pixel electrode is disposed on the insulating layer and is physically and electrically connected to the drain electrode through the contact hole formed on the first passivation layer, the second passivation layer, and the insulating layer.

9. The thin film transistor array panel of claim 8, further comprising:
a gate line including the gate electrode;
a data line including the source electrode; and
a connection area disposed at an end of at least one of the gate line and the data line.

10. The thin film transistor array panel of claim 9, wherein:
the connection area includes:
a first conductive layer which is made of the same material as the gate line and is formed on the insulating substrate at the time of forming the gate line;
a gate insulating layer formed on the first conductive layer;
a semiconductor layer formed on the gate insulating layer;
a second conductive layer physically and electrically connected to the first conductive layer through a first contact hole through which is formed on the gate insulating layer and the semiconductor layer to expose the first conductive layer; and
a first passivation layer formed on the second conductive layer and the gate insulating layer;
a second passivation layer formed on the first passivation layer;
an insulating layer formed on the second passivation layer; and
a connection electrode physically and electrically connected to the second conductive layer through a second contact hole which is formed on the first passivation layer, the second passivation layer, and the insulating layer to expose the second conductive layer.

11. The thin film transistor array panel of claim 10, wherein:
the second conductive layer is made of the same material as the source electrode and the drain electrode at the time of forming the source electrode and the drain electrode.

12. The thin film transistor array panel of claim 11, wherein:

the connection electrode is made of the same material as the pixel electrode as the time of forming the pixel electrode.

13. The thin film transistor array panel of claim 1, wherein:
the semiconductor layer includes any one of amorphous silicon and polysilicon.

14. The thin film transistor array panel of claim 1, wherein:
the semiconductor layer includes oxide semiconductor.

15. A manufacturing method of a thin film transistor array panel, comprising:
forming a gate electrode on an insulating substrate;
forming a gate insulating layer on the gate electrode;
forming a semiconductor layer on the gate insulating layer;
performing a photo-lithography process using a mask including a half-transmitting part which is formed in an area corresponding to a position at which a drain electrode is formed;
forming a source electrode and a drain electrode on the semiconductor layer and the gate insulating layer while facing each other; and
forming a pixel electrode connected to the drain electrode and applied with a voltage from the drain electrode,
wherein a thickness of the gate insulating layer which overlaps the drain electrode but does not overlap the semiconductor layer is formed to be thinner than that which overlaps the semiconductor layer.

16. The manufacturing method of claim 15, wherein:
the half-transmitting part is formed in an area corresponding to a position at which the source electrode is formed.

17. The manufacturing method of claim 15, further comprising:
forming a first passivation layer formed on exposed portions of the source electrode, the drain electrode, the gate insulating layer, and the semiconductor layer; and
forming a second passivation layer formed on the first passivation layer.

18. The manufacturing method of claim 17, further comprising:
forming a common electrode disposed on the second passivation layer and applied with a common voltage having a predetermined magnitude; and
forming an insulating layer disposed on the common electrode.

19. The manufacturing method of claim 18, further comprising:
forming a contact hole through the first passivation layer, the second passivation layer, and the insulating layer to expose the drain electrode.

20. The manufacturing method of claim 19, wherein:
the pixel electrode is disposed on the insulating layer and is physically and electrically connected to the drain electrode through the contact hole.

\* \* \* \* \*